United States Patent
Mishima et al.

(10) Patent No.: US 10,297,776 B2
(45) Date of Patent: May 21, 2019

(54) ORGANIC EL ELEMENT

(71) Applicant: JOLED INC., Tokyo (JP)

(72) Inventors: Kosuke Mishima, Tokyo (JP); Yoshiyuki Ota, Tokyo (JP); Junko Tanaka, Tokyo (JP); Takahiro Komatsu, Tokyo (JP); Hiroshi Katagiri, Tokyo (JP)

(73) Assignee: JOLED INC., Tokyo (JP)

( * ) Notice: Subject to any disclaimer, the term of this patent is extended or adjusted under 35 U.S.C. 154(b) by 295 days.

(21) Appl. No.: 15/204,288

(22) Filed: Jul. 7, 2016

(65) Prior Publication Data

US 2017/0012231 A1    Jan. 12, 2017

(30) Foreign Application Priority Data

Jul. 9, 2015    (JP) .................. 2015-137547

(51) Int. Cl.
*H01L 29/08* (2006.01)
*H01L 51/50* (2006.01)
(Continued)

(52) U.S. Cl.
CPC ...... *H01L 51/5004* (2013.01); *H01L 27/3244* (2013.01); *H01L 51/0097* (2013.01);
(Continued)

(58) Field of Classification Search
CPC ................................. H01L 51/5004
(Continued)

(56) References Cited

U.S. PATENT DOCUMENTS

2002/0146589 A1* 10/2002 Akiyama ............ H01L 51/5012
428/690
2004/0062949 A1   4/2004 Pfeiffer et al.
(Continued)

FOREIGN PATENT DOCUMENTS

JP    2004-514257    5/2004
JP    2004-342582    12/2004
(Continued)

OTHER PUBLICATIONS

U.S. Appl. No. 15/220,852 to Kosuke Mishima et al., filed Jul. 27, 2016.

*Primary Examiner* — Ajay Arora
(74) *Attorney, Agent, or Firm* — Greenblum & Bernstein, P.L.C.

(57) ABSTRACT

An organic electroluminescence (EL) element including an anode, a cathode opposing the anode, a light-emitting layer between the anode and the cathode, a hole transport layer in contact with the light-emitting layer, between the light-emitting layer and the anode, and an electron transport layer in contact with the light-emitting layer, between the light-emitting layer and the cathode. A difference between a lowest unoccupied molecular orbital (LUMO) level of an organic material included in the light-emitting layer and a LUMO level of an organic material included in the electron transport layer is greater than a difference between a highest occupied molecular orbital (HOMO) level of an organic material included in the hole transport layer and a HOMO level of the organic material included in the light-emitting layer.

20 Claims, 10 Drawing Sheets

(51) Int. Cl.
 *H01L 27/32* (2006.01)
 *H01L 51/00* (2006.01)

(52) U.S. Cl.
 CPC ...... *H01L 51/5012* (2013.01); *H01L 51/5056* (2013.01); *H01L 51/5072* (2013.01); *H01L 2227/323* (2013.01); *H01L 2251/5338* (2013.01); *H01L 2251/552* (2013.01); *H01L 2251/558* (2013.01); *Y02E 10/549* (2013.01)

(58) Field of Classification Search
 USPC .......................................................... 257/40
 See application file for complete search history.

(56) References Cited

U.S. PATENT DOCUMENTS

| | | |
|---|---|---|
| 2004/0227143 A1 | 11/2004 | Redecker et al. |
| 2005/0122038 A1 | 6/2005 | Kinoshita et al. |
| 2006/0158104 A1 | 7/2006 | Iijima et al. |
| 2006/0214151 A1 | 9/2006 | Abe et al. |
| 2009/0191427 A1 | 7/2009 | Liao et al. |
| 2011/0095678 A1* | 4/2011 | Ogita .................... C07C 211/61 313/504 |
| 2012/0229020 A1* | 9/2012 | Yonehara ............ H01L 51/5072 313/504 |

FOREIGN PATENT DOCUMENTS

| | | |
|---|---|---|
| JP | 2006-041396 | 2/2006 |
| JP | 2006-073636 | 3/2006 |
| JP | 2006-172762 | 6/2006 |
| JP | 2006-303456 | 11/2006 |
| JP | 2009-147276 | 7/2009 |
| JP | 2011-511458 | 4/2011 |
| WO | 2004/060027 | 7/2004 |
| WO | 2009/097108 | 8/2009 |

* cited by examiner

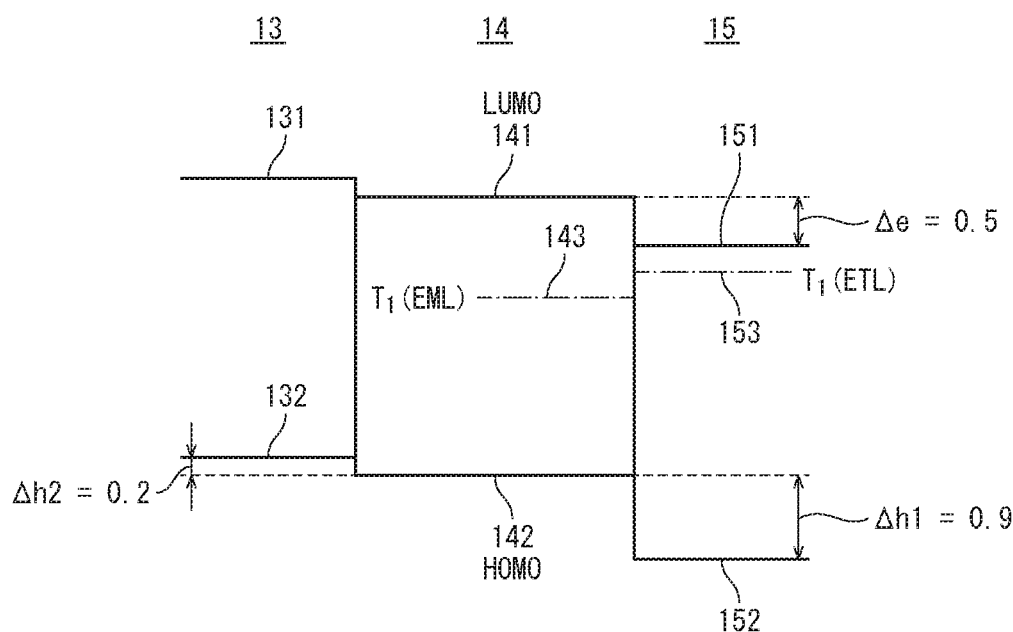

ORGANIC EL ELEMENT

This application is based on an application No. 2015-137547 filed in Japan, the contents of which are hereby incorporated by reference.

BACKGROUND OF THE DISCLOSURE (1) Technical Field

The present disclosure relates to energy band structure of organic materials in organic electroluminescence (EL) elements.

(2) Description of Related Art

In recent years, use of organic EL elements in display devices has become popular.

An organic EL element has a structure in which at least a light-emitting layer is sandwiched between an anode and a cathode. Organic EL elements also typically have a hole transport layer for supplying holes to the light-emitting layer, between the anode and the light-emitting layer, and an electron transport layer for supplying electrons to the light-emitting layer, between the light-emitting layer and the cathode.

When a voltage is applied between the anode and the cathode, electrons are injected from the electron transport layer into the lowest unoccupied molecular orbital (LUMO) of the light-emitting layer and holes are injected from the hole transport layer into the highest occupied molecular orbital (HOMO) of the light-emitting layer.

Further, in the light-emitting layer, an electric field is generated by the voltage applied between the anode and the cathode. Electrons injected to the LUMO of the light-emitting layer are influenced by the electric field and move, within the light-emitting layer, towards the anode. On the other hand, holes injected to the HOMO of the light-emitting layer are influenced by the electric field and move, within the light-emitting layer, towards the cathode.

In this way, the electrons and holes that move in the light-emitting layer recombine to generate excitons. The excitons generate light when returning to a ground state from an excited state (JP 2004-514257).

Various factors affect the lifespan of an organic EL element. Such factors include deterioration of organic material that forms the light-emitting layer. Deterioration of organic material is known to be facilitated by light emission. Further, it is known that distribution of light emission intensity in a thickness direction of the light-emitting layer can have a sharp peak (hereinafter, unless specified otherwise, "distribution" indicates distribution in the thickness direction). A sharp peak in the distribution of light emission intensity means that degradation of the organic material is particularly facilitated at a position indicated by the peak.

Such localized degradation of the organic material is thought to limit the lifespan of the light-emitting layer, and therefore a sharp peak in distribution of light emission intensity, i.e., a sharp peak in distribution of recombination, is a technical problem that is a factor inhibiting increasing lifespan of organic EL elements.

SUMMARY OF THE DISCLOSURE

In view of the above, the present disclosure aims to provide an organic EL element that has an improved lifespan.

In order to achieve the above aim, an organic EL element pertaining to one aspect of the present disclosure is an organic EL element comprising: an anode, a cathode opposing the anode, a light-emitting layer disposed between the anode and the cathode, a hole transport layer in contact with the light-emitting layer, disposed between the light-emitting layer and the anode, and an electron transport layer in contact with the light-emitting layer, disposed between the light-emitting layer and the cathode. A difference between a lowest unoccupied molecular orbital (LUMO) level of an organic material included in the light-emitting layer and a LUMO level of an organic material included in the electron transport layer is greater than a difference between a highest occupied molecular orbital (HOMO) level of an organic material included in the hole transport layer and a HOMO level of the organic material included in the light-emitting layer.

When mobility of electrons is greater than mobility of holes in the light-emitting layer, a majority of electrons injected to the light-emitting layer arrive in a vicinity of the interface between the hole transport layer and the light-emitting layer by the time they recombine, due to high mobility, and accumulate in the vicinity of the interface.

If injectability of electrons to the light-emitting layer from the electron transport layer were the same as injectability of holes to the light-emitting layer from the hole transport layer, a majority of holes injected to the light-emitting layer would recombine with the electrons accumulated in the vicinity of the interface. Accordingly, when there is no difference between carrier injectability of electrons and holes, distribution of recombination indicates a sharp peak in the vicinity of the interface between the hole transport layer and the light-emitting layer.

However, according to the organic EL element pertaining to the present disclosure, injectability of electrons to the light-emitting layer from the electron transport layer is lower than injectability of holes to the light-emitting layer from the hole transport layer.

According to the difference in injectability, the number of electrons injected to the light-emitting layer in a unit of time is less than the number of holes. Thus, accumulation of electrons in the vicinity of the interface between the hole transport layer and the light-emitting layer due to the difference in mobility does not change, but the amount of accumulation of electrons in the vicinity of the interface is kept lower than when there is no difference in carrier injectability. As a result, the peak of distribution of recombination in the vicinity of the interface is smoothed.

When compared to a case in which there is no difference in carrier injectability, the holes, which are injected in greater numbers than electrons in a unit of time, tend to not recombine with electrons in the vicinity of the interface with the hole transport layer, and the number increases of holes that recombine after moving further towards the electron transport layer from the region in the vicinity of the interface. As a result, recombination in a wide range in the thickness direction of the light-emitting layer occurs, and dispersion of distribution of recombination increases.

According to the organic EL element pertaining to the present disclosure, localized degradation of organic material, which limits lifespan of the light-emitting layer, is suppressed, making it possible to increase the lifespan.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one specific embodiment of the technology pertaining to the present disclosure.

FIG. 1 schematically illustrates a structure of an organic EL element pertaining to Embodiment 1.

FIG. 2 is a band diagram illustrating an energy band structure of the organic EL element pertaining to Embodiment 1.

FIG. 9A shows a TFT substrate. FIG. 9B shows an anode formed on the TFT substrate. FIG. 9C shows a bank layer formed on the anode and the TFT substrate. FIG. 9D shows a hole injection layer formed on the anode in an opening of the bank layer. FIG. 9E shows a hole transport layer formed on the hole injection layer in the opening of the bank layer. FIG. 9F shows a light-emitting layer formed on the hole transport layer in the opening of the bank layer.

FIG. 10A shows an electron transport layer formed on the light-emitting layer and the bank layer. FIG. 10B shows an electron injection layer formed on the electron transport layer. FIG. 10C shows an opposing electrode formed on the electron injection layer. FIG. 10D shows a sealing layer formed on the opposing electrode.

DESCRIPTION OF EMBODIMENTS

Figure 3A:
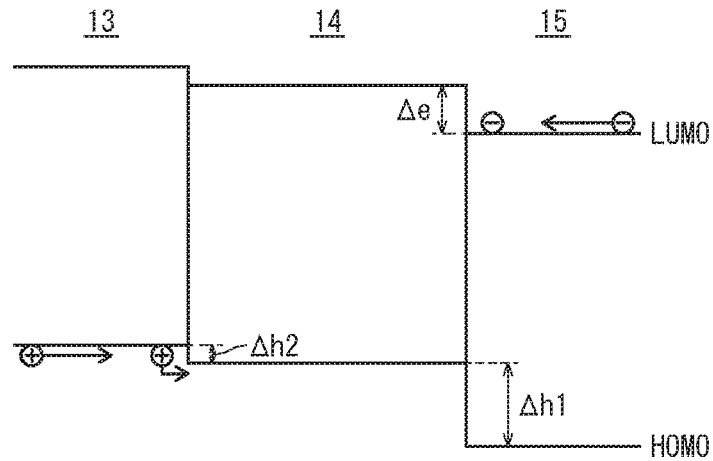
FIG. 3A, FIG. 3B, and FIG. 3C are schematic diagrams describing light-emitting regions of the organic EL element pertaining to Embodiment 1.

The following describes organic EL elements pertaining to embodiments. The following description provides an exemplification for describing configuration, operation, and effects pertaining to one aspect of the present disclosure. Aside from parts essential to the present disclosure, the present disclosure is not limited to the exemplification.

Embodiment 1

[1. Configuration of Organic EL Element]

FIG. 1 schematically illustrates a cross-section structure of an organic EL element pertaining to the present embodiment. An organic EL element 1 includes an anode 11, a hole injection layer 12, a hole transport layer 13, a light-emitting layer 14, an electron transport layer 15, an electron injection layer 16, and a cathode 17.

In the organic EL element 1, the anode 11 and the cathode 17 are disposed opposing each other and the light-emitting layer 14 is disposed between the anode 11 and the cathode 17.

The hole transport layer 13 is disposed in contact with the light-emitting layer 14 on the anode 11 side of the light-emitting layer 14. The hole injection layer 12 is disposed between the hole transport layer 13 and the anode 11.

The electron transport layer 15 is disposed in contact with the light-emitting layer 14 on the cathode 17 side of the light-emitting layer 14. The electron injection layer 16 is disposed between the electron transport layer 15 and the cathode 17.

The anode 11 includes a metal layer composed from a light-reflective metal material. Specific examples of metal materials that are light-reflective include silver (Ag), aluminium (Al), aluminium alloy, molybdenum (Mo), silver palladium copper alloy (APC), silver rubidium gold alloy (ARA), molybdenum chromium alloy (MoCr), molybdenum tungsten alloy (MoW), and nickel chromium alloy (NiCr).

The hole injection layer 12 has a function of promoting injection of holes into the light-emitting layer 14 from the anode 11. The hole injection layer 12 is, for example, composed from an oxide of Ag, Mo, chromium (Cr), vanadium (V), tungsten (W), nickel (Ni), or iridium (Ir), or from an electrically conductive polymer material such as poly(3, 4-ethylenedioxythiophene) polystyrene sulfonate (PEDOT: PSS).

The hole transport layer 13 has a function of transporting holes injected from the hole injection layer 12 to the light-emitting layer 14. For example, polyfluorene or a derivative thereof, or a polymer compound such as polyarylamine or a derivative thereof may be used.

The light-emitting layer 14 sandwiched between and in contact with the hole transport layer 13 and the electron transport layer 15 has a function of emitting light by using recombination of holes and electrons. A known organic material may be used as a material to form the light-emitting layer 14. For example, a phosphorescent material may be used, such as an oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, fluorescent substance of a rare earth complex or similar, or metal complex emitting phosphorescence such as tris(2-phenylpyridine) iridium.

The electron transport layer 15 has a function of transporting electrons supplied from the cathode 17 to the light-emitting layer 14. The electron transport layer 15 is, for example, formed from an organic material that has high electron transport mobility, doped with a metal selected from alkali metals or alkaline earth metals. As the organic material used in the electron transport layer 15, for example, a π-electron system low-molecular-weight organic material may be used, such as an oxydiazole derivative (OXD), a triazole derivative (TAZ), or a phenanthroline derivative (BCP, Bphen). The electron transport layer 15 has a thickness in an inclusive range from 10 nm to 100 nm.

The electron injection layer 16 is a functional layer including a metal or metal oxide. The electron injection layer 16 increases electron injectability from the cathode 17 to the electron transport layer 15. As a material of the electron injection layer 16, an electron-injecting material may be selected such as lithium fluoride (LiF), sodium fluoride (NaF), quinolinol lithium complex (Liq), Ba, or Ag.

The cathode 17 includes at least one of a metal layer formed from a metal material and a metal oxide layer formed from a metal oxide. Thickness of a metal layer included in the cathode 17 is thin, set to an inclusive range of 1 nm to 50 nm, and light-transmissive. The metal material is light-reflective, but because the thickness of the metal layer is equal to or less than 50 nm, light transmission can be ensured. Accordingly, a portion of light from the light-emitting layer 14 is reflected at the cathode 17 but a remaining portion is transmitted through the cathode 17.

As the metal material that forms the metal layer included in the cathode 17, Ag, an Ag alloy mainly composed of Ag, Al, or an Al alloy mainly composed of Al may be used. As an Ag alloy, a magnesium silver alloy (MgAg) or iridium silver alloy may be used. Ag basically has a low resistivity, Ag alloys are preferable in that they have excellent heat and corrosion resistance and can maintain good electrical conductivity over a long period of time. As an Al alloy, a magnesium aluminium alloy (MgAl) or lithium aluminium alloy (LiAl) may be used. As other alloys that may be used, a lithium magnesium alloy or a lithium iridium alloy may be used.

The metal layer included in the cathode 17 may be a simple layer formed from an Ag layer or a MgAg alloy layer, may be a layered structure including an Mg layer and an Ag layer (Mg/Ag), or may be a layered structure including an MgAg alloy layer and an Ag layer (MgAg/Ag).

Further, the cathode 17 may be a simple metal layer or a simple metal oxide layer, or may be a layered structure in which a metal oxide layer composed of a metal oxide such as ITO or IZO is layered on the metal layer.

[2. Energy Band Structure]

The organic EL element 1 is characterized by an energy band structure of the hole transport layer 13, the light-emitting layer 14, and the electron transport layer 15. The following describes energy levels of organic material forming the layers as energy levels of each layer.

FIG. 2 is a band diagram illustrating an energy band structure of the organic EL element 1. In FIG. 2, the LUMO energy level (hereinafter, "LUMO level") and the HOMO energy level (hereinafter, "HOMO level") of only the hole transport layer 13, the light-emitting layer 14, and the electron transport layer 15 are illustrated, and energy levels of other layers are not shown.

[2.1 Energy Barriers]

An energy barrier to injection of electrons from the electron transport layer 15 to the light-emitting layer 14 (hereinafter, "electron injection barrier $\Delta e$") is defined by an absolute value of difference between a LUMO level 141 of the light-emitting layer 14 and a LUMO level 151 of the electron transport layer 15. In the present embodiment, the electron injection barrier $\Delta e$ is 0.5 eV.

An energy barrier to injection of holes from the hole transport layer 13 to the light-emitting layer 14 (hereinafter, "hole injection barrier $\Delta h2$") is defined by an absolute value of difference between a HOMO level 132 of the hole transport layer 13 and a HOMO level 142 of the light-emitting layer 14. In the present embodiment, the hole injection barrier $\Delta h2$ is 0.2 eV.

Typically, a conventional organic EL element has an energy band structure in which the electron injection barrier $\Delta e$ is smaller than the hole injection barrier $\Delta h2$. For example, in JP 2009-147276 an organic EL element is disclosed in which the electron injection barrier $\Delta e$ is 0.06 eV and the hole injection barrier $\Delta h2$ is 0.39 eV.

In contrast, the organic EL element 1 is characterized in that the electron injection barrier $\Delta e$ and the hole injection barrier $\Delta h2$ satisfy Expression (1), below. Further, the electron injection barrier $\Delta e$ and the hole injection barrier $\Delta h2$ preferably satisfy Expression (2), below. In the present embodiment, the energy band structure is set so the electron injection barrier $\Delta e$ is 0.3 eV greater than the hole injection barrier $\Delta h2$ in the organic EL element 1.

$$\Delta e > \Delta h2 \qquad \text{Expression (1)}$$

$$\Delta e - \Delta h2 \geq 0.3 \text{ eV} \qquad \text{Expression (2)}$$

Further, an energy barrier to injection of holes from the light-emitting layer 14 to the electron transport layer 15 (hereinafter, "hole injection barrier $\Delta h1$") is defined by an absolute value of difference between the HOMO level 142 of the light-emitting layer 14 and a HOMO level 152 of the electron transport layer 15. In the present embodiment, the hole injection barrier $\Delta h1$ is 0.9 eV The organic EL element 1 is characterized in that the hole injection barrier $\Delta h1$ and the hole injection barrier $\Delta h2$ satisfy Expression (3), below.

$$\Delta h1 > \Delta h2 \qquad \text{Expression (3)}$$

Further, the organic EL element 1 is characterized in that the electron injection barrier $\Delta e$ and the hole injection barrier $\Delta h1$ satisfy Expression (4), below. Further, the electron injection barrier $\Delta e$ and the hole injection barrier $\Delta h1$ preferably satisfy Expression (5), below. In the present embodiment, the energy band structure is set so the hole injection barrier $\Delta h1$ is 0.4 eV greater than the electron injection barrier $\Delta e$ in the organic EL element 1.

$$\Delta e < \Delta h1 \qquad \text{Expression (4)}$$

$$\Delta h1 - \Delta e \geq 0.4 \text{ eV} \qquad \text{Expression (5)}$$

[2.2. $T_1$ Levels]

In FIG. 2, lowest excited triplet state energy levels (hereinafter, "$T_1$ levels") of the light-emitting layer 14 and of the electron transport layer 15 are indicated by dot-dash lines.

The organic EL element 1 is characterized in that a $T_1$ level $T_{1(eml)}$ 143 of the light-emitting layer 14 and a $T_1$ level $T_{1(etl)}$ 153 satisfy Expression (6), below.

$$T_{1(eml)} < T_{1(etl)} \qquad \text{Expression (6)}$$

Thus, excited triplet state energy movement from the light-emitting layer 14 to the electron transport layer 15 is suppressed and non-radiative deactivation is suppressed.

[3. Light-Emitting Region]

Figure 3B:
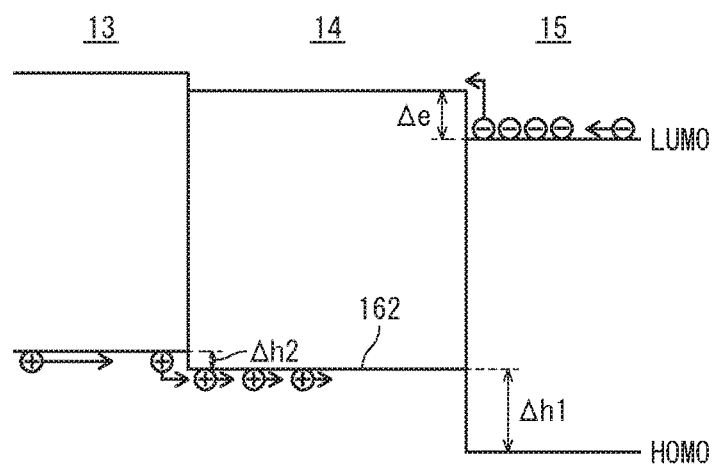
Figure 3C:
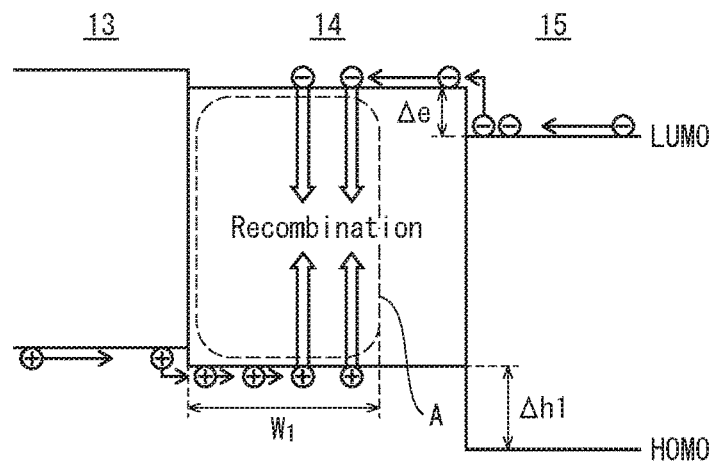

The following describes a light-emitting region of the organic EL element 1. FIG. 3A, FIG. 3B, and FIG. 3C are diagrams schematically illustrating three states from application of a drive voltage to the organic EL element 1 until light emission. In the diagrams, magnitudes of electron and hole mobility are indicated by lengths of arrows attached to carriers.

In the organic EL element 1, when a drive voltage is applied, in the initial stage illustrated in FIG. 3A, electrons move towards the light-emitting layer 14 in the LUMO of the electron transport layer 15 and holes move towards the light-emitting layer 14 in the HOMO of the hole transport layer 13.

Here, the holes overcome the hole injection barrier $\Delta h2$ by using energy from the application of the drive voltage, and are injected to the HOMO of the light-emitting layer 14. In contrast, as indicated by Expression (1), the electron injection barrier $\Delta e$ is greater than the hole injection barrier $\Delta h2$, and therefore injection of electrons to the light-emitting layer 14 is more suppressed than injection of holes to the light-emitting layer 14.

As a result, in the initial state illustrated in FIG. 3A, injection speed of electrons is less than injection speed of holes to the light-emitting layer 14, and electrons accumulate in the vicinity of the interface between the electron transport layer 15 and the light-emitting layer 14. Here, "injection speed" with respect to electrons and holes means a number of carriers injected to the light-emitting layer 14 in a unit of time.

Subsequently, as illustrated in FIG. 3B, holes injected to the light-emitting layer 14 move towards the electron transport layer 15 in the HOMO of the light-emitting layer 14. Here, even if holes arrive at the interface with the electron transport layer 15, the hole injection barrier $\Delta h1$ is greater than the hole injection barrier $\Delta h2$, as indicated by Expression (3), and therefore a majority of holes that receive only energy from the application of the drive voltage cannot overcome the hole injection barrier $\Delta h1$, and therefore escape of the holes to the electron transport layer 15 is suppressed.

Further, when the holes move within the light-emitting layer 14 and approach the electron transport layer 15, these holes and the electrons accumulated in the electron transport layer 15 are attracted to one another with stronger force, due to an electric field effect. However, as indicated in Expression (4), the electron injection barrier $\Delta e$ is less than the hole injection barrier $\Delta h1$, and therefore at the interface between the light-emitting layer 14 and the electron transport layer 15, injection of electrons to the light-emitting layer 14 is facilitated more than escape of holes to the electron transport layer 15. In other words, the electron injection barrier $\Delta e$ being less than the hole injection barrier $\Delta h1$ has an effect of promoting injection of electrons to the light-emitting layer 14.

Thus, in the state in FIG. 3B in which holes in the light-emitting layer 14 approach the electron transport layer 15, injection speed of electrons increases without increasing drive voltage, and balance of carriers injected to the light-emitting layer 14 is improved.

Electrons injected to the light-emitting layer 14 have a higher mobility than holes and can move in a very short period of time to the hole transport layer 13. However, as illustrated in FIG. 3C, in this state many holes have moved towards the electron transport layer 15 in the light-emitting layer 14. Thus, in the organic EL element 1, holes are distributed in a wide region of width W1 from the interface between the hole transport layer 13 and the light-emitting layer 14.

As a result, in the organic EL element 1, in a region A indicated by a dashed line in FIG. 3C, electrons and holes recombine, excitons are formed, and the region A becomes a light-emitting region.

Figure 4A:
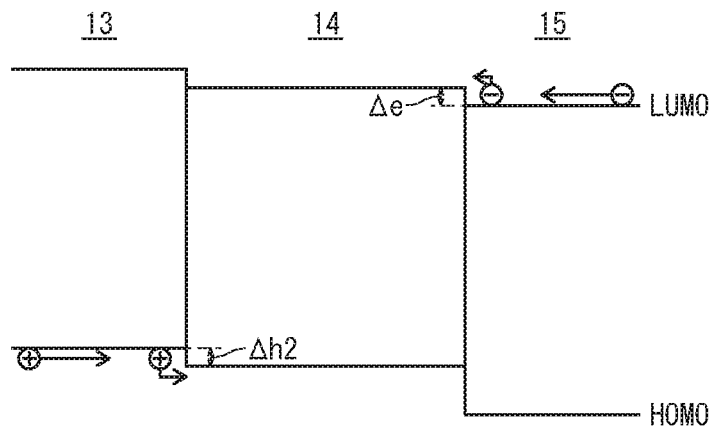
FIG. 4A, FIG. 4B, and FIG. 4C are schematic diagrams describing light-emitting regions of an organic EL element for which an electron injection barrier Δe and a hole injection barrier Δh2 have equal values.
Figure 4B:
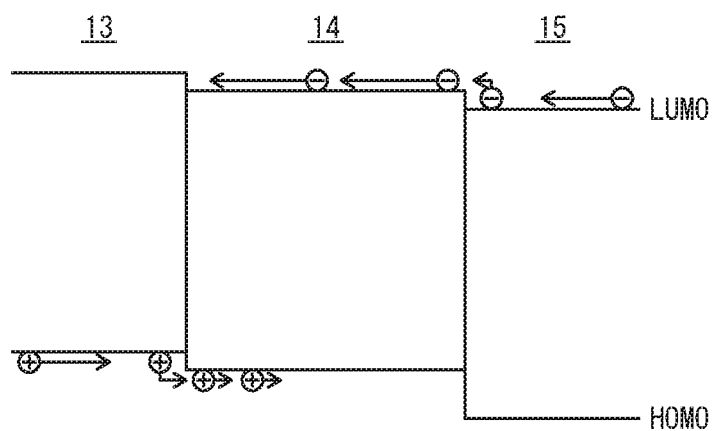

Here, as a comparison, a case is described with reference to FIG. 4A, FIG. 4B, and FIG. 4C, of an organic EL element that has an energy band structure in which the electron injection barrier $\Delta e$ and the hole injection barrier $\Delta h2$ have the same values. When the electron injection barrier $\Delta e$ and the hole injection barrier $\Delta h2$ have the same values, it is envisaged that in the initial stage after application of a drive voltage, holes and electrons are injected to the light-emitting layer 14 at the same injection speed as each other, as illustrated in FIG. 4A. The holes and the electrons injected to the light-emitting layer 14 move due to the influence of their respective electric fields, but mobility of the holes in the light-emitting layer 14 is lower than mobility of the electrons in the light-emitting layer 14, as illustrated in FIG. 4B.

Figure 4C:
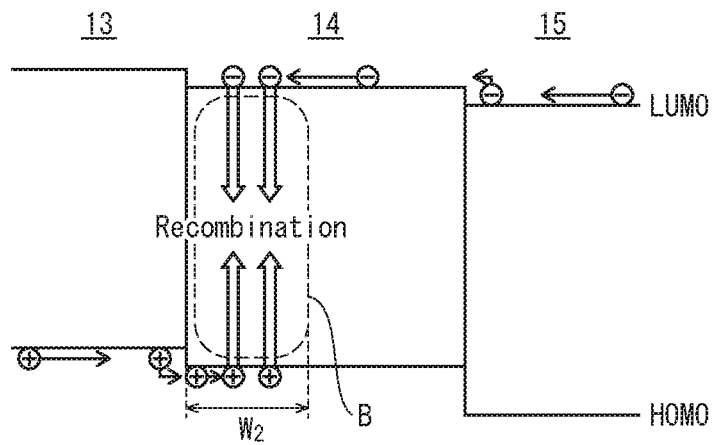

Thus, as illustrated in FIG. 4C, while the electrons in the light-emitting layer 14 move as far as the vicinity of the hole transport layer 13, the holes cannot get far from the interface between the hole transport layer 13 and the light-emitting layer 14 and are concentrated in a narrow range of width W2 from the interface. As a result, in the organic EL element in which the electron injection barrier $\Delta e$ and the hole injection barrier $\Delta h2$ have the same values, a region B of narrow width becomes the light-emitting region.

Thus, when compared with the light-emitting region B in a case in which the electron injection barrier $\Delta e$ and the hole injection barrier $\Delta h2$ have the same values, as illustrated in FIG. 4C, the light-emitting region A of the organic EL element 1 is a wider region that extends farther towards the electron transport layer 15, as illustrated in FIG. 3C.

[4. Experiments]

[4.1. Influence of Energy Band Structure on Lifespan]

Three varieties of organic EL element having different energy band structures from each other were created as test bodies and lifespans of each of the test bodies were measured. Measurement of lifespans was performed by continuously driving the test bodies to obtain times until luminance decreased by 5% from initial values.

Figure 5A:
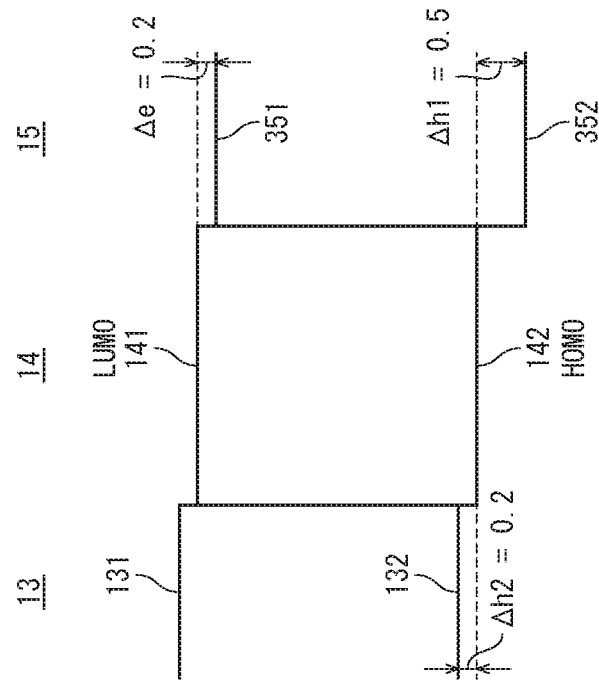
FIG. 5A is a band diagram illustrating an energy band structure of a comparative example 1.
Figure 5B:
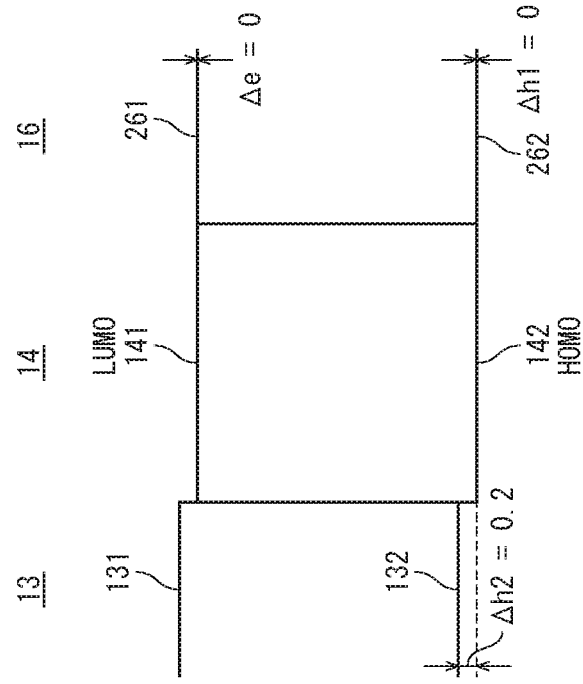
FIG. 5B is a band diagram illustrating an energy band structure of a comparative example 2.

The three varieties of test bodies consisted of a working example of the energy band structure illustrated in FIG. 2, a comparative example 1 of the energy band structure illustrated in FIG. 5A, and a comparative example 2 of the energy band structure illustrated in FIG. 5B. HOMO level values for relevant thin films included in the three test bodies were measured by using a photoelectron spectrometer (Riken Keiki Co., Ltd., model AC-2). For each of the relevant thin films, a LUMO level value was obtained by subtracting an energy gap of an optical absorption edge of the thin film from the HOMO level value for the thin film.

The working example, as illustrated in FIG. 2, had an electron injection barrier $\Delta e$ of 0.5 eV and a hole injection barrier $\Delta h2$ of 0.2 eV, so the difference between the electron injection barrier $\Delta e$ and the hole injection barrier $\Delta h2$ was 0.3 eV.

The comparative example 1 and the comparative example 2, as illustrated in FIG. 5A and FIG. 5B, had the same values as the working example illustrated in FIG. 2 for the LUMO level 131 and the HOMO level 132 of the hole transport layer 13, and the LUMO level 141 and the HOMO level 142 of the light-emitting layer 14.

For the comparative example 1 and the comparative example 2, the hole transport layer 13 and the light-emitting layer 14 were formed with the same material and structure as for the working example, and the hole injection barrier $\Delta h2$ had the same value of 0.2 eV as the working example shown in FIG. 2, as illustrated in FIG. 5A and FIG. 5B.

The comparative example 1 was different from the working example in that the electron transport layer 15 had an abbreviated structure and the electron injection barrier $\Delta e$ was 0 eV, as illustrated in FIG. 5A. Thus, in the comparative example 1, the difference between the electron injection barrier $\Delta e$ and the hole injection barrier $\Delta h2$ was −0.2 eV.

The comparative example 2, as illustrated in FIG. 5B, was different from the working example in that the electron injection barrier $\Delta e$ was 0.2 eV and the difference between the electron injection barrier $\Delta e$ and the hole injection barrier $\Delta h2$ was 0 eV. The differences between the comparative example 2 and the working example were due to the organic material of the electron transport layer 15 being different.

Figure 6A:
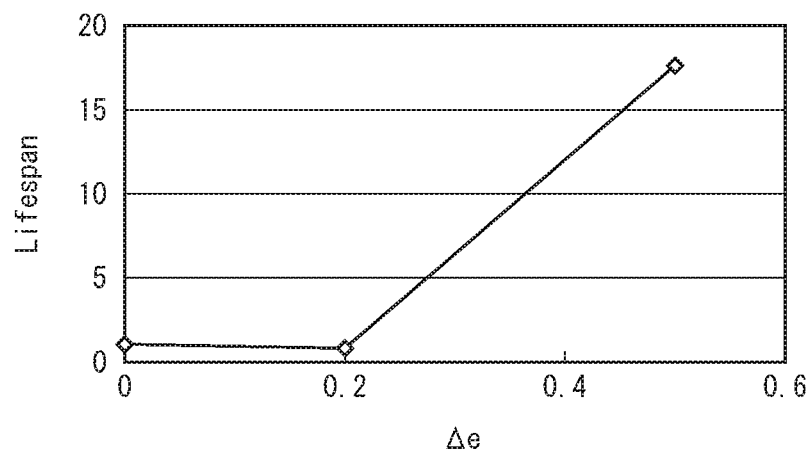
FIG. 6A is a graph illustrating differences in lifespan according to differences in the electron injection barrier.

FIG. 6A is a graph showing results of lifespan measurement. In FIG. 6A, the vertical axis shows normalized values for which the measured value of comparative example 1 is a reference value.

The electron injection barrier $\Delta e$ value plotted at 0 eV is for the comparative example 1.

The electron injection barrier $\Delta e$ value plotted at 0.2 eV is for the comparative example 2, for which the lifespan value was 0.8.

The electron injection barrier $\Delta e$ value plotted at 0.5 eV is for the working example, for which the lifespan value was 17.6.

Comparing the comparative example 1 to the comparative example 2, a large change in lifespan was not observed. However, the working example indicated a longer lifespan than the comparative example 1 and the comparative example 2.

From this result, it can be considered that a longer lifespan was achieved by the greater value of the electron injection barrier $\Delta e$, which sufficiently suppressed injection speed of electrons to the light-emitting layer 14, which widened the light-emitting region of the light-emitting layer 14 as described with reference to FIG. 3A, FIG. 3B, and FIG. 3C.

Accordingly, when the electron injection barrier $\Delta e$ is at least 0.5 eV, increased lifespan of the organic EL element can be expected.

Further, the difference between the electron injection barrier $\Delta e$ and the hole injection barrier $\Delta h2$ was −0.2 eV, 0 eV, and 0.3 eV for comparative example 1, comparative example 2, and the working example, respectively, and the working example indicated a significant increase in lifespan. For the working example, the difference between the electron injection barrier $\Delta e$ and the hole injection barrier $\Delta h2$ was large, and therefore it can be considered that the difference between the injection speed of electrons and the injection speed of holes to the light-emitting layer 14 was large.

Accordingly, when the difference between the electron injection barrier $\Delta e$ and the hole injection barrier $\Delta h2$ is at least 0.3 eV, increased lifespan of the organic EL element can be expected.

[4.2. Influence of Energy Band Structure on Light Emittance Efficiency]

Light emission efficiency was measured for the working example, comparative example 1, and comparative example 2. The measurement of light emission efficiency was performed by using luminance with respect to a unit amount of current (hereinafter, "current efficiency").

Figure 6B:
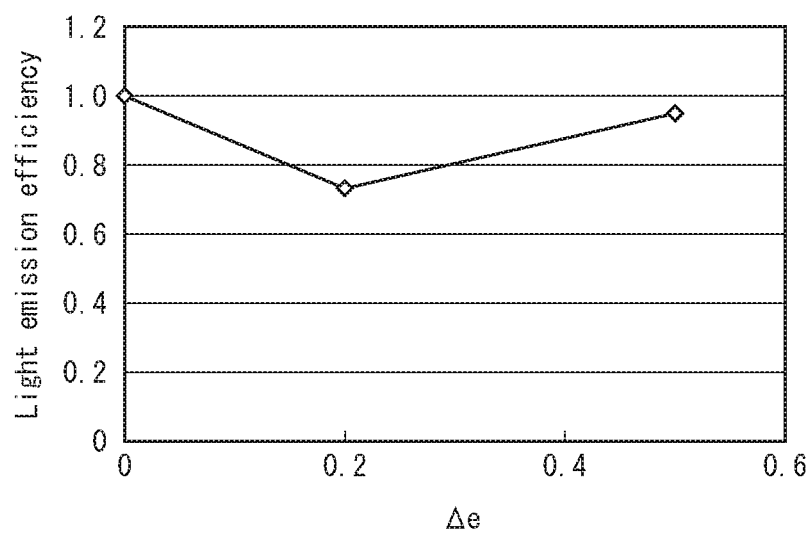
FIG. 6B is a graph illustrating differences in light emission efficiency according to differences in the electron injection barrier.

FIG. 6B is a graph showing results of measuring current efficiency. In FIG. 6B, the vertical axis shows normalized values for which the measured value of comparative example 1 is a reference value.

The electron injection barrier $\Delta e$ value plotted at 0 eV is for the comparative example 1.

The electron injection barrier $\Delta e$ value plotted at 0.2 eV is for the comparative example 2, for which the light emission efficiency was 0.73.

The electron injection barrier $\Delta e$ value plotted at 0.5 eV is for the working example, for which the light emission efficiency was 0.95.

Comparing comparative example 1 and comparative example 2, a decrease in light emission efficiency can be seen in comparative example 2. This decrease in light emission efficiency can be considered to result from a decrease in electron injectability to the light-emitting layer 14 that correlates with the increase in the electron injection barrier $\Delta e$. In other words, increasing the electron injection barrier $\Delta e$ contributes to increasing the lifespan of the organic EL element, but is detrimental to light emission efficiency.

However, the working example improves light emission efficiency when compared to comparative example 2. The improvement of light emission efficiency in the working example can be considered to result from facilitation of electron injection to the light-emitting layer 14 by the effect described with reference to FIG. 3B under "[3. Light-emitting region]", which compensates for the decrease in electron injectability due to the increase in the electron injection barrier $\Delta e$.

The effect of facilitating electron injection to the light-emitting layer 14, as described with reference to FIG. 3B, becomes stronger the greater the hole injection barrier $\Delta h1$ is than the electron injection barrier $\Delta e$. Here, the difference between the hole injection barrier $\Delta h1$ and the electron injection barrier $\Delta e$ was 0.3 eV for comparative example 2 and 0.4 eV for the working example.

Accordingly, as long as the difference between the hole injection barrier $\Delta h1$ and the electron injection barrier $\Delta e$ is at least 0.4 eV, a decrease in light emission efficiency can be suppressed.

[4.3. Influence of Thickness of Electron Transport Layer on Lifespan and Light Emission Efficiency]

Excitons cause energy movement to metal atoms in a metal layer when the metal layer is adjacent, and undergo non-radiative deactivation.

According to the energy band structure illustrated in FIG. 2, in the light emission process illustrated in FIG. 3A, FIG. 3B, and FIG. 3C, distribution of excitons in the light-emitting layer 14 is increased towards the side of the electron transport layer 15. Further, in the present embodiment, the electron injection layer 16 and the cathode 17 include metal layers. Thus, there is a risk of excitons that are distributed in the light-emitting layer 14 and approaching the electron transport layer 15 causing energy transfer to these metal layers (hereinafter, the effect of excitons causing energy transfer to metal atoms included in the electron injection layer 16 and the cathode 17 and undergoing non-radiative deactivation is referred to as "cathode quenching").

In order to suppress cathode quenching, it is preferable to increase distance between excitons and metal layers. In the organic EL element 1 pertaining to the present embodiment, increasing a distance between the electron injection layer 16 and the interface between the light-emitting layer 14 and the electron transport layer 15, i.e., increasing thickness of the electron transport layer 15, is considered to be effective in suppressing cathode quenching.

According to the energy band structure illustrated in FIG. 2, three varieties of organic EL element having different thicknesses of the electron transport layer 15 from each other were created as test bodies and lifespans and light emission efficiencies of each of the test bodies were measured. Measurement of lifespans was performed by using times until luminance decreased by 5% from initial values, and measurement of light emission efficiency was performed by using current efficiency.

The three test bodies had thicknesses D for the electron transport layer 15 equal to 5 nm, 10 nm, and 15 nm, respectively.

Figure 7A:
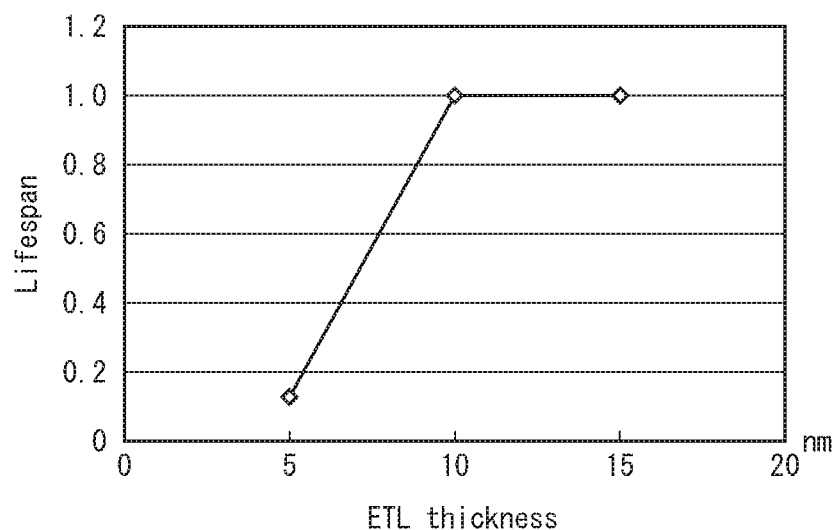
FIG. 7A is a graph illustrating differences in lifespan according to differences in thickness of an electron transport layer.
Figure 7B:
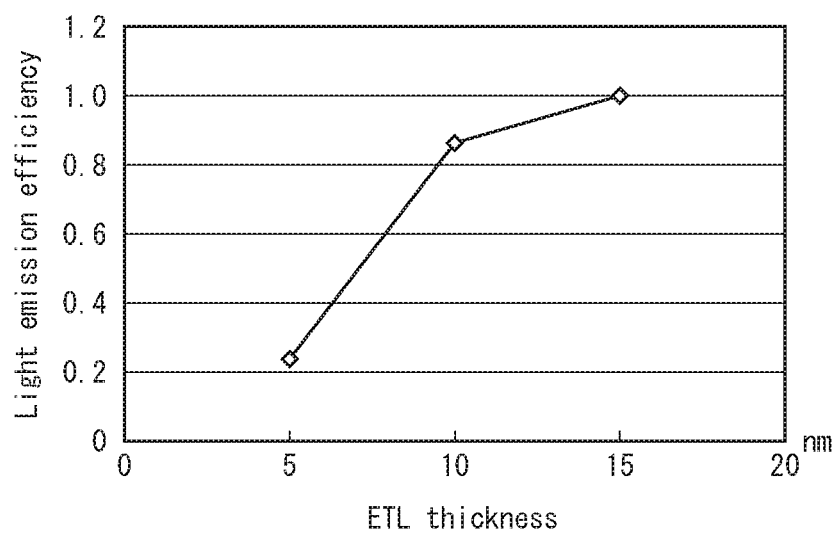
FIG. 7B is a graph illustrating differences in light emission efficiency according to differences in thickness of the electron transport layer.

FIG. 7A is a graph illustrating differences in lifespan according to differences in thickness of the electron transport layer 15, and FIG. 7B is a graph illustrating differences in light emission efficiency according to differences in thickness of the electron transport layer 15. In each graph, the vertical axis shows normalized values for which the measured value for the test body that had the electron transport layer 15 of thickness 15 nm is a reference value.

Comparing light emission efficiency, as shown in FIG. 7B, the thinner the thickness of the electron transport layer 15, the lower the current efficiency. In particular, in the test body that had the thickness of 5 nm, the decrease in light emission efficiency was significant.

Specifically, for the test body having the thickness of 15 nm, the light emission efficiency is the reference value, and for the test body that had the thickness of 10 nm, the light emission efficiency was 0.86. In the test body that had the thickness of 5 nm, the light emission efficiency was 0.24.

Further, comparing lifespans, as shown in FIG. 7A, there was no difference between the test body that had the thickness of 10 nm and the test body that had the thickness of 15 nm. However, the test body that had the thickness of 5 nm was greatly reduced to 0.13. The reduction in lifespan of the test body that had the thickness of 5 nm can be considered to be due to the low initial value of luminance due to cathode quenching requiring a shorter time for a further decrease.

From this result, it can be considered that as long as thickness of the electron transport layer 15 is at least 10 nm, there will be no significant decrease in lifespan or light emission efficiency due to cathode quenching.

Accordingly, when the energy band structure illustrated in FIG. 2 is adopted, in order to suppress cathode quenching, the thickness of the electron transport layer 15 is preferably at least 10 nm.

Note that thickening of the electron transport layer 15 increases the amount of light absorption at the electron transport layer 15. In order to avoid excessive attenuation of light transmitted through the electron transport layer 15, thickness of the electron transport layer 15 is preferably not greater than 100 nm.

[5. Summary]

As described above, according to the organic EL element 1 pertaining to Embodiment 1, the electron injection barrier $\Delta e$, which is a difference between the LUMO level of the organic material included in the light-emitting layer 14 and the LUMO level of the organic material included in the electron transport layer 15, is greater than the hole injection barrier $\Delta h2$, which is a difference between the HOMO level of the organic material included in the hole transport layer 13 and the HOMO level of the organic material included in the light-emitting layer 14.

Thus, injection speed of electrons to the light-emitting layer 14 is kept lower than injection speed of holes to the light-emitting layer 14. According to this difference in injection speed, more holes in the light-emitting layer 14 can move towards the electron transport layer 15, and therefore the region created by excitons expands towards the electron transport layer 15, smoothing concentration of distribution of electrons.

As a result, in the organic EL element 1, the light-emitting region of the light-emitting layer 14 is not just in the vicinity of the interface with the hole transfer layer 13, and is expanded towards the electron transport layer 15. According to this expansion of the light-emitting region, localized degradation of organic material in the light-emitting layer 14 is mitigated, making it possible to increase the lifespan of the organic EL element 1.

In particular, the electron injection barrier $\Delta e$ is preferably at least 0.3 eV greater than the hole injection barrier $\Delta h2$. When the electron injection barrier $\Delta e$ and the hole injection barrier $\Delta h2$ satisfy this relationship, a substantial increase in lifespan can be expected.

Further, the electron injection barrier $\Delta e$ of the organic EL element 1 is preferably at least 0.5 eV. When the electron injection barrier $\Delta e$ is at least 0.5 eV, a substantial increase in lifespan can be expected.

Further, the hole injection barrier $\Delta h1$, which is a difference between the HOMO level of the organic material included in the light-emitting layer 14 and the HOMO level of the organic material included in the electron transport layer 15 is greater than the hole injection barrier $\Delta h2$, which is the difference between the HOMO level of the organic material included in the hole transport layer 13 and the HOMO level of the organic material included in the light-emitting layer 14.

When the hole injection barrier $\Delta h1$ and the hole injection barrier $\Delta h2$ satisfy this relationship, escape of holes from the light-emitting layer 14 to the electron transport layer 15 can be suppressed, and an increase in light-emission efficiency can be expected.

However, an increase in the electron injection barrier $\Delta e$ decreases electron injectability to the light-emitting layer 14, which can cause an increase in drive voltage. However, the organic EL element 1 has an energy band structure in which the hole injection barrier $\Delta h1$ is greater than the electron injection barrier $\Delta e$. When an energy band structure is adopted in which the hole injection barrier $\Delta h1$ is greater than the electron injection barrier $\Delta e$, and when holes in the light-emitting layer 14 and electrons in the electron transport layer 15 are mutually attracted by the electric field effect, injection of electrons to the light-emitting layer 14 is promoted more than escape of holes to the electron transport layer 15.

Thus, according to the organic EL element 1, along with an increase in the electron injection barrier $\Delta e$, a decrease in electron injectability to the light-emitting layer 14 is compensated for, and an increase in drive voltage can therefore be suppressed.

Further, the hole injection barrier $\Delta h1$ is preferably at least 0.4 eV greater than the electron injection barrier $\Delta e$. When the hole injection barrier $\Delta h1$ and the electron injection barrier $\Delta e$ satisfy this relationship, the effect of suppressing the increase in drive voltage can be expected.

Further, according to the organic EL element 1, thickness of the electron transport layer 15 is in an inclusive range from 10 nm to 100 nm. In the organic EL element 1 pertaining to the present Embodiment, thickness of the electron transport layer 15 corresponds to distance from the electron injection layer 16 to the interface between the light-emitting layer 15 and the electron transport layer 14.

When thickness of the electron transport layer 15 is at least 10 nm, even when distribution of excitons in a region of the light-emitting layer 14 approaches the electron transport layer 15, there is sufficient distance between the excitons and the metal layer including in the electron injection layer 16. Thus, cathode quenching can be suppressed.

Note that according to the structure illustrated in FIG. 1, only the electron injection layer 16 is disposed between the cathode 17 and the electron transport layer 15, but the organic EL element 1 may be configured with another functional layer between the cathode 17 and the electron transport layer 15 in addition to the electron injection layer 16, or another functional layer instead of the electron injection layer 16.

In the case of such a functional layer including at least one of a metal or metal oxide, there is a risk of excitons in the light-emitting layer 14 causing energy transfer to metal atoms in the functional layer. However, even in such a case, as long as the distance from the interface between the light-emitting layer 14 and the electron transport layer 15 to the functional layer closest to the light-emitting layer 14 is at least 10 nm, non-radiative deactivation of excitons due to energy transfer can be suppressed.

Further, the organic EL element 1, for example, may be configured without a metal layer in the electron injection layer 16 or without the electron injection layer 16 illustrated in FIG. 1.

In such configurations, the cathode 17 becomes the closest metal layer to the interface between the light-emitting layer 14 and the electron transport layer 15. Accordingly, in such a configuration, in order to suppress cathode quenching, the distance between the cathode 17 and the interface between the light-emitting layer 14 and the electron transport layer 15 is preferably in an inclusive range from 10 nm to 100 nm.

In particular, when the electron injection layer 16 does not include a metal layer and any other functional layer disposed between the cathode 17 and the electron transport layer 15 does not include metal or metal oxide, it is not necessary that the thickness of the electron transport layer 15 be at least 10 nm. When a functional layer disposed between the cathode 17 and the electron transport layer 15 does not include metal or metal oxide, the effect of suppressing cathode quenching can be achieved as long as a total thickness of all layers from the cathode 17 to the interface between the light-emitting layer 14 and the electron transport layer 15 is in an inclusive range from 10 nm to 100 nm. In this case, the electron transport layer 15 may be formed to have a thickness in an inclusive range from 1 nm to 100 nm.

Typically, when a light-emitting region in a light-emitting layer is in the vicinity of the electron transport layer, it is easier for excitons to transfer energy from the light-emitting layer to the electron transport layer.

However, according to organic EL element 1, the $T_1$ level $T_{1(etl)}$ 153 of the electron transport layer 15 is greater than the $T_1$ level $T_{1(eml)}$ of the light-emitting layer 14. Thus, according to the organic EL element 1, excited triplet state energy movement from the light-emitting layer 14 to the electron transport layer 15 is suppressed and non-radiative deactivation of excitons in the light-emitting layer 14 is suppressed.

Embodiment 2

According to Embodiment 2, an organic EL display panel 100 is described in which a plurality of the organic EL element 1 described according to Embodiment 1 is arrayed on a substrate.

[1. Configuration of Organic EL Display Panel]

Figure 8:
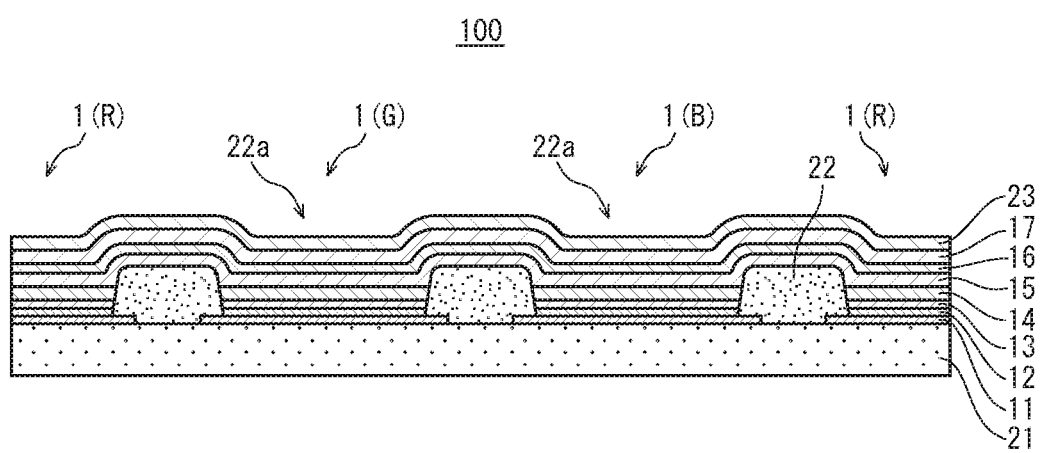
FIG. 8 is a partial cross-section of an organic EL display panel pertaining to Embodiment 2.

FIG. 8 is a partial cross-section of the organic EL display panel 100 (see FIG. 11) pertaining to Embodiment 2. The organic EL display panel 100 has a plurality of pixels, each pixel including the organic EL elements 1(R), 1(G), 1(B), which emit red, green, and blue light respectively. FIG. 8 illustrates a cross-section centered on one of the organic EL elements 1(B), which emits blue light.

In the organic EL display panel 100, each of the organic EL elements 1 are so-called "top-emission" types that emit light in a forwards direction (towards the top of the page in FIG. 8).

The, organic EL element 1(R), the organic EL element 1(G), and the organic EL element 1(B) have substantially the same configuration as each other, and therefore the following describes them together as the organic EL element 1.

As illustrated in FIG. 8, the organic EL element 1 includes a TFT substrate 21, the anode 11, a bank layer 22, the hole injection layer 12, the hole transfer layer 13, the light-emitting layer 14, the electron transport layer 15, the electron injection layer 16, the cathode 17, and a sealing layer 23. The TFT substrate 21, the electron transport layer 15, the electron injection layer 16, the cathode 17, and the sealing layer 23 are not formed for each pixel, but are common to a plurality of the organic EL elements 1 included in the organic EL display panel 100.

In the following, description is omitted of the configuration of the organic EL element 1 described according to Embodiment 1, and only elements added to the organic EL display panel 100 pertaining to Embodiment 2 are described.

The TFT substrate 21 includes a base material that is insulative, a thin film transistor (TFT) layer, and an interlayer insulating layer. In the TFT layer is a drive circuit for each pixel. The base material is, for example, a substrate made from a glass material. As a glass material, alkali-free glass, soda glass, non-fluorescent glass, phosphate glass, borate glass, or quartz glass may be used. The interlayer insulating layer is made from a resin material, and planarizes a stepped upper surface of the TFT layer. As the resin material, a positive photosensitive material may be used. Further, as the photosensitive material, acrylic resin, polyimide resin, siloxane resin, or phenol resin may be used.

Further, although not shown in FIG. 8, a contact hole is formed for each pixel in the interlayer insulating layer of the TFT substrate 21.

The anode 11 is disposed on the interlayer insulating layer of the TFT substrate 21. The anode 11 is formed for each pixel, and is electrically connected to the TFT layer via the contact hole. The anode 11 may be a simple metal layer, or may be a layered structure in which a layer made from a metal oxide such as ITO or IZO is layered on a metal layer.

The bank layer 22 is disposed on the anode 11, leaving a portion of an upper surface of the anode 11 exposed and covering a surrounding region of the anode 11. A region of the upper surface of the anode 11 that is not covered by the bank layer 22 (hereinafter, "opening") corresponds to a sub-pixel. In other words, the bank layer 22 has an opening 22a for each sub-pixel.

The hole injection layer 12, the hole transport layer 13, and the light-emitting layer 14 are layered in this order on the anode 11 within the opening 22a.

According to Embodiment 2, portions of the bank layer 22 that are not disposed on the anode 11 are disposed on the TFT substrate 21. In other words, for the portions of the bank layer 22 not on the anode 11, a bottom surface of the bank layer 22 is in contact with the upper surface of the TFT substrate 21.

The bank layer 22 is made from, for example, an insulative material (for example, acrylic resin, polyimide resin, novolac resin, or phenolic resin). If the light-emitting layer 14 is formed by using a coating application method, the bank layer 22 functions as a structure to prevent applied ink from overflowing, and if the light-emitting layer 14 is formed by using vapor deposition, the bank layer 22 functions as a structure for mounting a vapor deposition mask. According to the present embodiment, the bank layer 22 is made from a resin material that is, for example, a positive photosensitive material. Further, as the photosensitive material, acrylic resin, polyimide resin, siloxane resin, or phenol resin may be used. According to the present embodiment, phenolic resin is used.

On the cathode 17, which is disposed across the sub-pixels, is disposed the sealing layer 23, which is intended to suppress degradation of the light-emitting layer 14 due to contact with moisture, oxygen, etc. Because the organic EL display panel 100 is a top-emission type, material of the sealing layer 23 can be selected from a light transmissive material such as silicon nitride (SiN) or silicon oxynitride (SiON).

Although not shown in FIG. 8, a color filter and upper substrate may be bonded on top of the sealing layer 23 via the sealing resin. By bonding the upper substrate, the hole transport layer 13, the light-emitting layer 14, and the electron transport layer 15 can be protected from water, air, etc.

[2. Manufacture of Organic EL Element]

Method of manufacture of the organic EL element 1 is described with reference to FIG. 9A, FIG. 9B, FIG. 9C, FIG. 9D, FIG. 9E, FIG. 9F, FIG. 10A, FIG. 10B, FIG. 10C, and FIG. 10D. FIG. 9A to FIG. 10D show cross-sections schematically illustrating manufacture of the organic EL element 1.

Figure 9A:
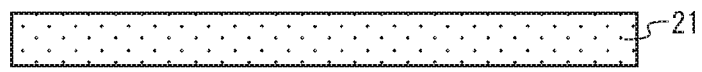
FIG. 9A to FIG. 9F are partial cross-sections schematically illustrating a portion of manufacture of an organic EL element pertaining to Embodiment 2.
Figure 9B:
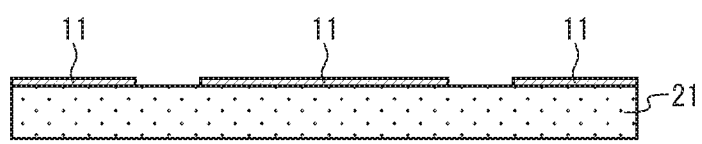

Initially, as shown in FIG. 9A, the TFT substrate 21 is prepared. Subsequently, for each sub-pixel, a thin film of thickness in an inclusive range from 50 nm to 500 nm is formed by vacuum deposition or sputtering of a metal material, forming the anode 11 as shown in FIG. 9B.

Figure 9C:
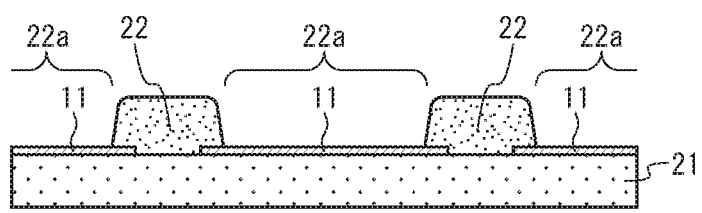

Subsequently, on the anode 11, bank layer resin that is the material of the bank layer 22 is uniformly applied to form a bank material layer. For the bank layer resin, for example, phenolic resin that is a positive photosensitive material is used. Pattern forming in the shape of the bank layer 22 is performed by exposing the bank material layer to light and performing developing, and the bank layer 22 is formed by baking (FIG. 9C). This baking is performed, for example, at a temperature in an inclusive range from 150° C. to 210° C. for 60 minutes. According to the bank layer 22, the opening 22a is defined, which is a region in which the light-emitting layer 14 is formed.

In the process of forming the bank layer 22, surface treatment using an alkaline solution, water, an organic solvent, or similar may be performed, and plasma treatment of a surface of the bank layer 22 may be performed. Surface treatment of the bank layer 22 is performed for the purposes of adjusting the contact angle of ink applied to the opening 22a and imparting liquid repellency to a surface of the bank layer 22.

Figure 9D:
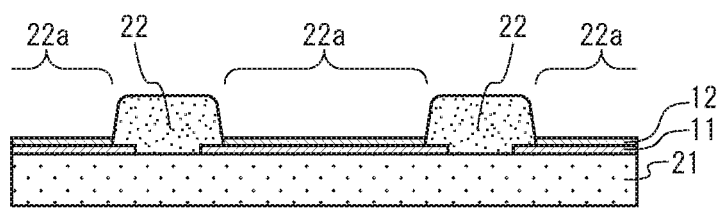

Subsequently, by using mask deposition or application by inkjet, material of the hole injection layer 12 is deposited, and baked to form the hole injection layer 12 as shown in FIG. 9D.

Figure 9E:
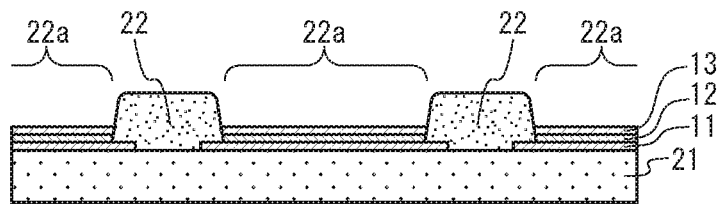

Subsequently, ink including material of the hole transport layer 13 is applied to the opening 22a defined by the bank layer 22, and baked to form the hole transport layer 13 as shown in FIG. 9E.

Figure 9F:
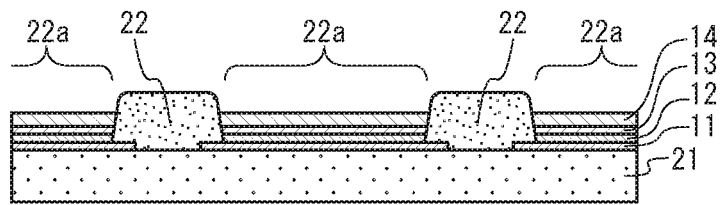

Similarly, ink that includes material of the light-emitting layer 14 is applied and baked to form the light-emitting layer 14 as shown in FIG. 9F.

Figure 10A:
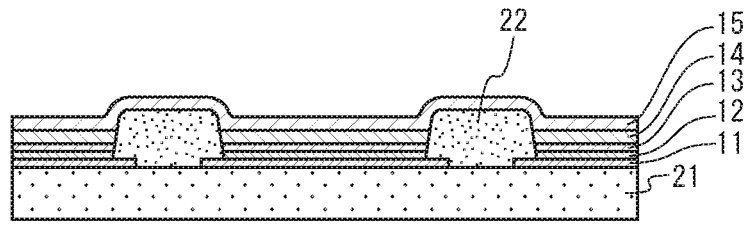
FIG. 10A to FIG. 10D are partial cross-sections schematically illustrating a continuation of the portion of manufacture of the organic EL element in FIG. 9A to FIG. 9F.
Figure 10B:
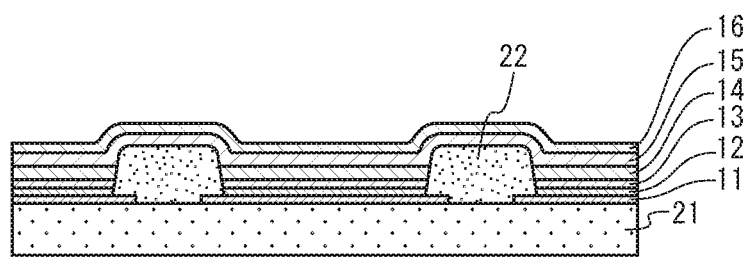

Subsequently, as shown in FIG. 10A, on the light-emitting layer 14, the electron transport layer 15 is formed to have a film thickness in an inclusive range from 10 nm to 100 nm by using vacuum deposition or similar. The electron transport layer 15 is also formed on the bank layer 22. Subsequently, as shown in FIG. 10B, on the electron transport layer 15, the electron injection layer 16 is formed by using vacuum deposition or similar.

Figure 10C:
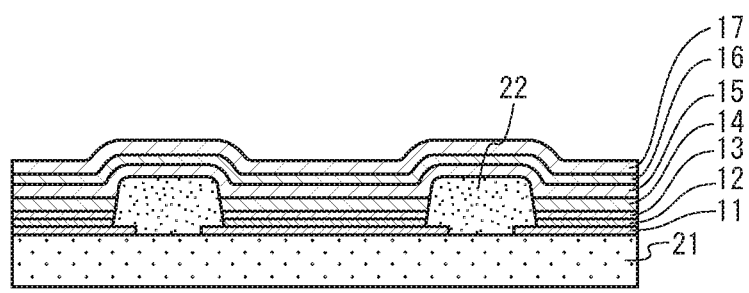

Subsequently, as shown in FIG. 10C, on the electron injection layer 16, the cathode 17 is formed by using vacuum deposition, sputtering, or similar, of a metal material to form a thin film.

Figure 10D:
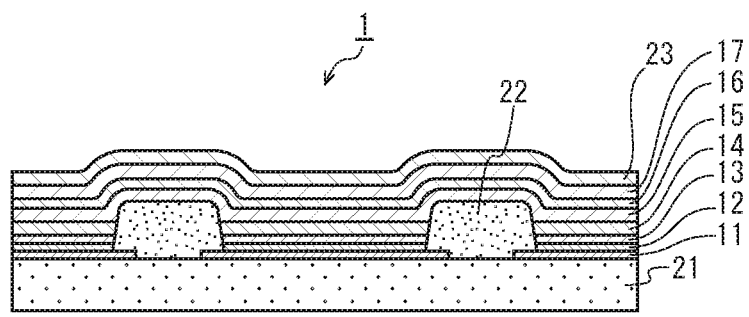

Subsequently, on the cathode 17, the sealing layer 23 is formed by using sputtering, CVD, or similar, on a light-transmissive material such as SiN or SiON to form a thin film as shown in FIG. 10D.

According to the processes described above, the organic EL element 1 is completed, and the organic EL display panel 100 that includes a plurality of the organic EL element 1 is also thereby completed. Note that the color filter and the upper substrate may be bonded onto the sealing layer 23.

[3. Overall Configuration of Organic EL Display Device]

Figure 11:
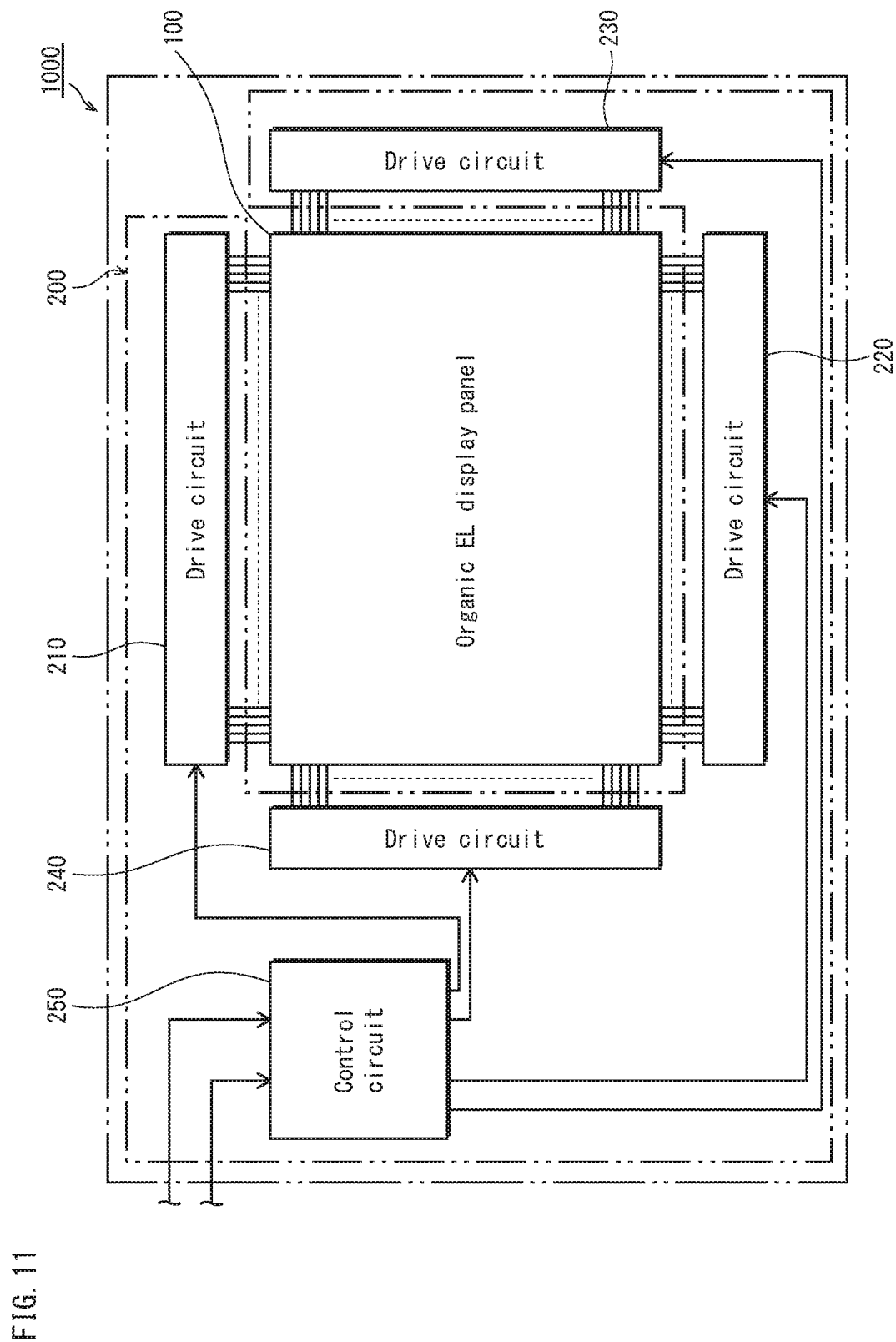
FIG. 11 is a block diagram illustrating an organic EL display device equipped with the organic EL element pertaining to Embodiment 2.

FIG. 11 is a schematic block diagram illustrating a configuration of an organic EL display device 1000. As shown in FIG. 11, the organic EL display device 1000 includes the organic EL display panel 100 and a drive controller 200 connected thereto. The driver controller 200 includes four drive circuits 210, 220, 230, 240 and a control circuit 250.

Note that the organic EL display device 1000 is not limited to the depicted example arrangement of the driver controller 200 relative to the organic EL display panel 100.

<Modifications>

Embodiment 1 and Embodiment 2 are described above, but the present disclosure is not limited to these embodiments, for example the following modifications can be implemented.

(Modification 1)

The organic EL element 1 of each embodiment is provided with the hole injection layer 12 and the electron injection layer 16, but the organic EL element can be implemented without one or more of these two layers.

(Modification 2)

Regarding conditions for ranges of film thickness for the embodiments above, an entirety of a sub-pixel region defined by the opening 22a need not satisfy the conditions, as long as film thickness of a central portion of each sub-pixel satisfies the conditions for film thickness described above.

(Modification 3)

According to Embodiment 2, the base material of the organic EL element 1 is described as having glass as an insulative material, but this is just an example. As the insulative material for the base material, resin or ceramics may be used, for example. As a ceramic for the base material, alumina may be used, for example. As a resin for the base material, an insulative material such as polyimide resin, acrylic resin, styrene resin, polycarbonate resin, epoxy resin, polyethersulfone, polyethylene, polyester, or silicone resin may be used. When resin is used for the base material, the resin may be flexible, but this is usually associated with high permeability to oxygen and moisture, which may be assumed to easily lead to deterioration of metal material caused by oxygen and moisture. However, the organic EL display panel 100 pertaining to the present disclosure is particularly suited to manufacturing using a flexible resin, due to the stabilizing of properties with respect to variation in doping concentration of metal material in the electron injection layer 16.

(Modification 4)

According to the embodiments, a top-emission type is implemented in which the anode 11 is a light-reflective anode and the cathode 17 is a light-transmissive cathode, but a bottom-emission type may be implemented in which a pixel electrode is a light-transmissive cathode and an opposing electrode is a light-reflective anode.

In such a case, for example, the cathode 17, as the pixel electrode, and the bank layer 22 are formed on the interlayer insulating layer of the TFT substrate 21. In the opening 22a, on the cathode 17, the electron injection layer 16, the electron transport layer 15, and the light-emitting layer 14 are formed in this order. Subsequently, the hole transport layer 13 and the hole injection layer 12 are formed thereon, and the anode 11 is formed thereon as a common electrode.

(Modification 5)

According to the embodiments, the hole transport layer 13 and the light-emitting layer 14 are manufactured by using ink coating, but this is just an example. For example, at least one of the hole transport layer 13 and the light-emitting layer 14 may be manufactured by using vapor deposition.

The organic EL element pertaining to the present disclosure is useful in various display devices such as televisions, displays for portable electronic devices, and illuminations, for home, public, or business use.

Although the technology pertaining to the present disclosure has been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

What is claimed is:

1. An organic electroluminescence (EL) element comprising:
   an anode;
   a cathode opposing the anode;
   a light-emitting layer disposed between the anode and the cathode;
   a hole transport layer in contact with the light-emitting layer, disposed between the light-emitting layer and the anode; and
   an electron transport layer in contact with the light-emitting layer, disposed between the light-emitting layer and the cathode, wherein
   a difference between a lowest unoccupied molecular orbital (LUMO) level of an organic material included in the light-emitting layer and a LUMO level of an organic material included in the electron transport layer is greater than a difference between a highest occupied molecular orbital (HOMO) level of an organic material included in the hole transport layer and a HOMO level of the organic material included in the light-emitting layer.

2. The organic EL element of claim 1, wherein
   the difference between the LUMO level of the organic material included in the light-emitting layer and the LUMO level of the organic material included in the electron transport layer is at least 0.3 eV greater than the difference between the HOMO level of the organic material included in the hole transport layer and the HOMO level of the organic material included in the light-emitting layer.

3. The organic EL element of claim 1, wherein
   a difference between the HOMO level of the organic material included in the light-emitting layer and a HOMO level of the organic material included in the electron transport layer is greater than the difference between the HOMO level of the organic material included in the hole transport layer and the HOMO level of the organic material included in the light-emitting layer.

4. The organic EL element of claim 3, wherein
   the difference between the HOMO level of the organic material included in the light-emitting layer and the HOMO level of the organic material included in the electron transport layer is greater than the difference between the LUMO level of the organic material included in the light emitting layer and the LUMO level of the organic material included in the electron transport layer.

5. The organic EL element of claim 4, wherein
   the difference between the HOMO level of the organic material included in the light-emitting layer and the HOMO level of the organic material included in the electron transport layer is at least 0.4 eV greater than the difference between the LUMO level of the organic material included in the light emitting layer and the LUMO level of the organic material included in the electron transport layer.

6. The organic EL element of claim 1, wherein
   the cathode includes at least one of metal and metal oxide, and
   a distance between the cathode and an interface between the light-emitting layer and the electron transport layer is at least 10 nm.

7. The organic EL element of claim 1, further comprising:
   a functional layer disposed between the cathode and the electron transport layer, the functional layer including at least one of metal and metal oxide, wherein
   a distance between the functional layer and an interface between the light-emitting layer and the electron transport layer is at least 10 nm.

8. The organic EL element of claim 1, wherein
   a lowest excited triplet state energy level of organic material included in the electron transport layer is higher than a lowest excited triplet state energy level of organic material included in the light-emitting layer.

9. The organic EL element of claim 1, wherein
   the difference between the LUMO level of the organic material included in the light-emitting layer and the LUMO level of the organic material included in the electron transport layer is at least 0.5 eV.

10. An organic electroluminescence (EL) element comprising:
    an anode;
    a cathode opposing the anode, the cathode including at least one of metal and metal oxide;
    a light-emitting layer disposed between the anode and the cathode;
    a hole transport layer in contact with the light-emitting layer, disposed between the light-emitting layer and the anode; and
    an electron transport layer in contact with the light-emitting layer, disposed between the light-emitting layer and the cathode, wherein a difference between a lowest unoccupied molecular orbital (LUMO) level of organic material included in the light-emitting layer and a LUMO level of organic material included in the electron transport layer is at least 0.5 eV, and a distance between the cathode and an interface between the light-emitting layer and the electron transport layer is at least 10 nm.

11. The organic EL element of claim 10, wherein
the difference between the LUMO level of the organic material included in the light-emitting layer and the LUMO level of the organic material included in the electron transport layer is greater than a difference between a highest occupied molecular orbital (HOMO) level of organic material included in the hole transport layer and a HOMO level of the organic material included in the light-emitting layer.

12. The organic EL element of claim 11, wherein
the difference between the LUMO level of the organic material included in the light-emitting layer and the LUMO level of the organic material included in the electron transport layer is at least 0.3 eV greater than the difference between the HOMO level of the organic material included in the hole transport layer and the HOMO level of the organic material included in the light-emitting layer.

13. The organic EL element of claim 10, wherein
a difference between the HOMO level of the organic material included in the light-emitting layer and a HOMO level of the organic material included in the electron transport layer is greater than the difference between the HOMO level of the organic material included in the hole transport layer and the HOMO level of the organic material included in the light-emitting layer.

14. The organic EL element of claim 13, wherein
the difference between the HOMO level of the organic material included in the light-emitting layer and the HOMO level of the organic material included in the electron transport layer is greater than the difference between the LUMO level of the organic material included in the light emitting layer and the LUMO level of the organic material included in the electron transport layer.

15. The organic EL element of claim 14, wherein
the difference between the HOMO level of the organic material included in the light-emitting layer and the HOMO level of the organic material included in the electron transport layer is at least 0.5 eV greater than the difference between the LUMO level of the organic material included in the light emitting layer and the LUMO level of the organic material included in the electron transport layer.

16. The organic EL element of claim 10, further comprising:
a functional layer disposed between the cathode and the electron transport layer, the functional layer including at least one of metal and metal oxide, wherein
a distance between the functional layer and an interface between the light-emitting layer and the electron transport layer is at least 10 nm.

17. The organic EL element of claim 10, wherein
a lowest excited triplet state energy level of organic material included in the electron transport layer is higher than a lowest excited triplet state energy level of organic material included in the light-emitting layer.

18. An organic electroluminescence (EL) element comprising:
an anode;
a cathode opposing the anode;
a light-emitting layer disposed between the anode and the cathode; and
an electron transport layer in contact with the light-emitting layer, disposed between the light-emitting layer and the cathode, wherein
a difference between a lowest unoccupied molecular orbital (LUMO) level of organic material included in the light-emitting layer and a LUMO level of organic material included in the electron transport layer is at least 0.5 eV.

19. An organic electroluminescence (EL) display panel in which the organic EL element of claim 1 is mounted in a plurality on a surface of a substrate.

20. An organic electroluminescence (EL) display panel in which the organic EL element of claim 1 is mounted in a plurality above a flexible substrate.

* * * * *